United States Patent [19]
Yazu et al.

[11] Patent Number: 4,617,181
[45] Date of Patent: Oct. 14, 1986

[54] SYNTHETIC DIAMOND HEAT SINK

[75] Inventors: Shuji Yazu; Shuichi Satoh, both of Hyogo, Japan

[73] Assignee: Sumitomo Electric Industries, Ltd., Osaka, Japan

[21] Appl. No.: 621,768

[22] Filed: Jun. 18, 1984

[30] Foreign Application Priority Data

Jul. 1, 1983 [JP] Japan ................................ 58-120475
Oct. 18, 1983 [JP] Japan ................................ 58-195564

[51] Int. Cl.⁴ ............................................. C01B 31/06
[52] U.S. Cl. ..................................................... 423/446
[58] Field of Search ........................................ 423/446

[56] References Cited

U.S. PATENT DOCUMENTS 2,947,609 8/1960 Strong ................................. 423/446
4,034,066 7/1977 Strong ................................. 423/446
4,042,673 8/1977 Strong ................................. 423/446

FOREIGN PATENT DOCUMENTS 47-44160 11/1972 Japan ................................... 423/446

OTHER PUBLICATIONS

Armagnac, "Popular Science", vol. 197, No. 3, 1970, pp. 82, 83, 134, & 137.
Strong, "J. Physical Chemistry", vol. 75, 1971, pp. 1838–1843.
Yamaoka et al, "J. of Crystal Growth", 37, No. 3, 1977, pp. 349–352.

Primary Examiner—John Doll
Assistant Examiner—Jackson Leeds
Attorney, Agent, or Firm—Sughrue, Mion, Zinn, Macpeak, and Seas

[57] ABSTRACT

A synthetic diamond heat sink which can be easily shaped and which ensures a consistently high thermal conductivity in which the diamond is a Type Ib diamond containing 50 to 100 ppm nitrogen. The synthetic diamond crystal has a shape similar to the crystal structure of a hexahedron synthesized by heating a carbon source, a solvent and a diamond seed crystal and the stability region of diamond at a high pressure. The resulting temperature gradient between the carbon source and seed crystal is adjusted to cause diamond growth on the seed crystal. The solvent employed is selected from the group of cobalt, nickel, iron, chromium and manganese. The diamond crystal is caused to grow as the temperature of the solvent is gradually decreased at a rate of 0.15 to 10° C. per hour so that the temperature of the seed crystal and growning diamond crystal is within a range the lower limit of which is a temperature 20° C. higher than the melting point of the solvent and carbon source system and the upper limit of which is a temperature 40° C. higher than the lower limit.

5 Claims, 17 Drawing Figures (DODECAHEDRON)

(OCTAHEDRON)

(OCTAHEXAHEDRON)

(HEXAHEDRON)

FIG. 3
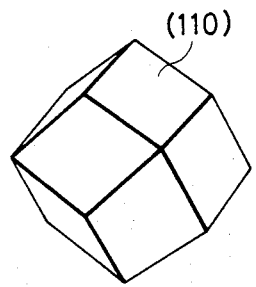
(DODECAHEDRON)
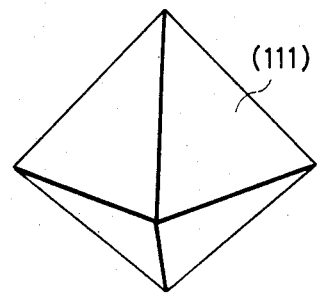
(OCTAHEDRON)
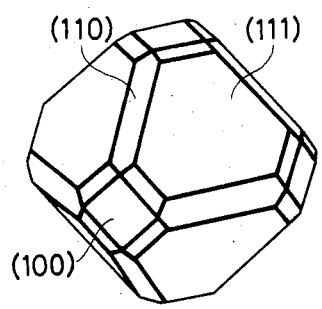
(OCTAHEXAHEDRON)
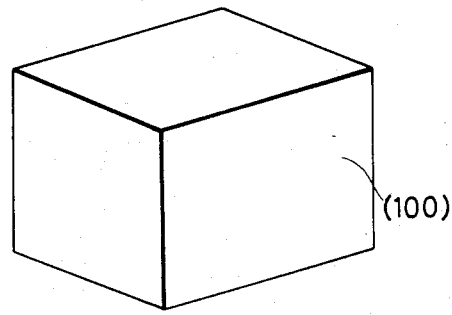
(HEXAHEDRON)

FIG. 4
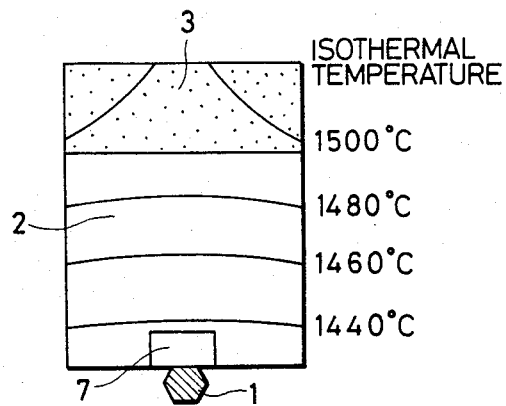
FIG. 5
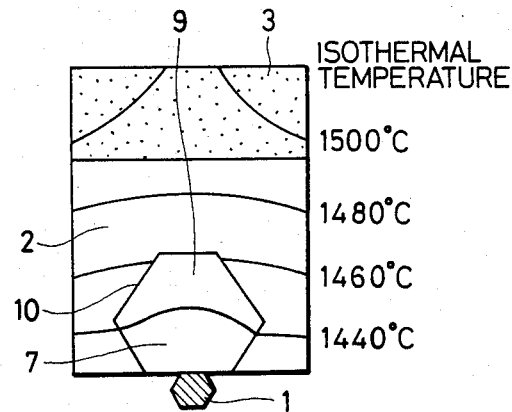
FIG. 6  FIG. 7
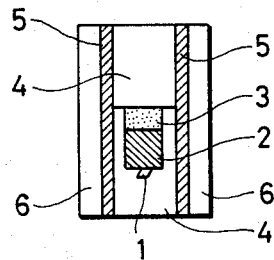 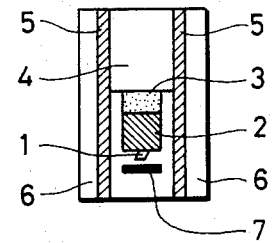

SYNTHETIC DIAMOND HEAT SINK

BACKGROUND OF THE INVENTION

With the continuing growth of the electronics industry, diamond finds an ever-increasing demand for use as heat sinks. The present invention relates to a diamond heat sink for use with electronic devices.

Pure diamond is the most heat conductive substance known and finds many industrial applications. Natural diamond as mined, however, varies greatly in thermal conductivity depending upon the nitrogen content. For a higher nitrogen content, diamond has a small thermal conductivity; its value at room temperature varies from about 24 W/cm°C. to 6 W/cm°C. depending upon the nitrogen content. Diamonds with less than 1 ppm of nitrogen are classified as Type IIa, and those having a higher nitrogen content as Type Ia. Type IIa diamonds generally have thermal conductivities higher than 20 W/cm°C. and are used as heat sinks for heat-generating electronic devices such as semiconductor leasers, diodes and microwave oscillating devices.

It is well known that synthetic single-crystal diamonds can be produced from a seed crystal using a temperature gradient process (see, for instance, U.S. Pat. No. 3,297,407). Furthermore, it is known that synthetic single-crystal diamonds can be produced using a temperature gradient process wherein dissolution of the diamond seed material in the melted catalyst-solvent metal during the process is prevented and a tendency for spontaneous nucleation of diamond crystals near the diamond seed material is suppressed (see U.S. Pat. Nos. 4,034,066 and 4,073,380).

Large synthetic diamonds having a diameter of 1 mm or more are generally produced by the temperature gradient process. As depicted in FIG. 1, the temperature gradient process involves producing a temperature difference $\Delta t$ between a carbon source 3 and a seed crystal 1 so as to grow a diamond crystal in a solvent metal 2. As shown in FIG. 2, the driving force for the crystal growth is a supersaturated concentration $\Delta c$ induced by the temperature difference $\Delta t$. By maintaining a predetermined temperature and pressure for a period of 70 to 100 hours, this process can yield a synthetic diamond of a size of 1 to 1.5 carats. Four examples of such synthetic diamonds currently available are shown in FIG. 3. Typical crystal forms are an octahedron or an octahexahedron consisting of combinations of large (111) planes, (100) planes and very small (110) planes. Most natural diamonds are, on the other hand, octahedral or dodecahedral.

Diamond applications include wire-drawing dies, bytes, bits and heat sinks. Except for bits, these devices or tools are generally in the form of hexehedron (see FIG. 3). Therefore, in order to obtain these tools of devices, octahedral, dodecahedral or octahexahedral diamonds must be ground or cut to the final hexahedral shape. Being the hardest material known, shaping diamonds requires a tremendous amount of time and money. Furthermore, diamond is very expensive and fines (excess diamond material) produced as a result of shaping are too precious to be discarded.

Therefore, the primary object of the present invention is to provide a method of producing synthetic diamonds in a hexahedral form close to the shape of the tool or device in which it is used.

Natural Type IIa diamonds are very rare and expensive, and thus heat sinks made of this type of diamond are used only in electronic devices of high reliability and long service life, typically, communications semiconductor lasers and microwave oscillating diodes. Even mined diamonds which are classified as Type IIa vary in heat conductivity with their nitrogen content, and hence are not consistent in their thermal properties.

Diamond is typically ground on a high-speed grinding wheel made of cast iron impregnated with a paste of rape oil containing diamond powder. Wear of the diamond differs greatly from one crystal plane to another. As previously mentioned, three prominent planes in diamonds are (100), (111) and (110); they have the following wear characteristics:

TABLE 1

| Plane | Wear | Conditions of Measurement |
|---|---|---|
| (100) | 12 mg/hr | Peripheral speed: 40 m/sec |
| (110) | 65 mg/hr | Load: 750 g |
| (111) | 1–2 mg/hr | Mesh size of diamond powder: #3000 |

Note:
Each plane was ground in the "easiest" work direction.

As the table shows, a diamond can be freely ground on the (110) plane, but if it is ground on the (111) plane, only the surface of the cast iron grinding wheel wears and the diamond can hardly be ground. Therefore, finding the correct or "easy" work plane is essential for precisely shaping the diamond to the desired size. For natural diamonds which are either a dodecahedron consisting of (110) planes or an octahedron with (111) planes it is not infrequent that the edge defining two adjacent planes is lost due to melting. Thus, finding the correct plane for shaping requires a great amount of skill and is error prone. As a further problem, most planes of a diamond are curved and a significant portion of them must be removed to provide a straight surface. Obviously, this results in a waste of energy and of the precious diamond, and results in a costly heat sink.

When the surface of a diamond heat sink is used as an electrode, it must be provided with a gold coating. With the coating technology available currently, it is difficult to attain a sufficient surface strength for all heat sinks. The surface of a diamond is so highly activated that is carries a significant amount of oxygen molecules. Therefore, if gold is directly vapor-deposited on the diamond, an adhesion strength sufficient to permit bonding to a device or lead wires is not obtained. To avoid this problem, a metal such as Ti or Cr which is highly reactive with oxygen is first deposited on the diamond surface by ion plating or sputtering, and then gold is coated on that metal by either the same technique of vapor deposition. However, it is difficult to effect exact control over the conditions of the surface treatment and the Ti or Cr coating, and a sufficient adhesion strength is not readily obtainable between the diamond and the Ti or Cr coating. Moreover, if lead wires are bonded to the gold film, the primer coat (Ti or Cr) may sometimes peel off the diamond.

Using a thermal gradient process developed some ten years ago, single-crystal synthetic diamonds can be produced having only an octahexahedral or octahedral form with large (111) planes (see R. H. Wentrof, *J. of Physical Chemistry*, vol. 75, no. 12, 1971). This is because no sophisticated temperature control techniques were available at that time and it was not clearly understood how the form of the single-crystal diamond synthesized by the thermal gradient process correlated to the synthesis temperature.

With recent improvements in the techniques of control over the synthesis temperature, researchers have attained an in-depth knowledge about the correlation between the synthesis temperature and the form of single-crystal diamonds produced by the thermal gradient process. According to their findings, a diamond in a hexaoctahedral form which has large (100) planes, and hence is closer to a hexahedron, can be produced in a temperature range the lower limit of which is a temperature 20° C. higher than the melting point of the carbon source and solvent metal system and the upper limit of which is a temperature 40° C. higher than that lower limit. In a range up to a temperature 50° C. higher than the upper limit, an octahexahedral crystal with large (111) planes is produced, and at even higher temperatures, an octahedron is formed. Of these forms, the one having a shape close to hexahedron is of commercial interest. However, a crude hexaoctahedral diamond having a shape close to that of a hexahedron has fairly large (111) planes, and the overall proportion of (100) planes is only 60 to 70%. Furthermore, with this crystal form, crude diamonds larger than 0.2 carat cannot be synthesized even if the process time is prolonged. The reason is that, as the diamond grows, the temperature of the growth point of its single crystal shifts toward the higher range (see FIGS. 4 and 5). In particular, the growing faces at the frontmost end (indicated at 9 and 10 in FIG. 5) come into contact with the hot solvent 2 and a large (111) plane (indicated at 10 in FIG. 5) is obtained. In other words, the more the crystal grows, the higher the temperature of the growing faces at the frontmost end, with the result that an octahexahedral diamond with large (111) planes or an octahedral diamond is more easily formed than a hexahedral diamond.

The problem with the conventional thermal gradient process is that it is unable to produce a large crude hexahedral diamond because the temperature of the seed crystal is kept constant throughout the synthesis. As mentioned earlier, most of the single crystal diamonds synthesized ten-odd years ago were in either an octahexahedral or octahedral form. The two major reasons are: in the absence of a sophisticated technique of temperature control, it is difficult to retain the temperature immediately above the melting point of the solvent metal for an extended period of time and the diamond was synthesized at higher temperature, and manufacturers attempted to keep the temperature of the seed crystal constant, neglecting the fact that the temperature of the single crystal changed as it grew.

SUMMARY OF THE INVENTION

The present invention provides a synthetic diamond heat sink that can be easily shaped and ensures a consistently high thermal conductivity. This has become possible by two features of the invention. First, a nitrogen content that ensures a consistently high thermal conductivity is selected. Secondly, a synthetic diamond having well-defined crystal planes is used as the material for the heat sink.

As already mentioned, the present invention provides a process for synthesizing a crude hexahedral diamond of commercial interest without experiencing the defects of the conventional temperature gradient process.

According to the present invention, synthetic single-crystal diamonds can be stably produced by the temperature gradient process using a solvent metal having an appropriate amount of carbon without preventing dissolution of the diamond seed material in the melted catalyst solvent metal and the suppression of the spontaneous nucleation of diamond crystal. Furthermore, synthetic single-crystal diamonds of near-hexehedron form can be produced by varying the temperature of the solvent metal in response to the growth rate of the single crystal.

The present invention provides a low-priced and highly thermally conductive heat sink for electronic devices made of a synthetic single-crystal diamond having a nitrogen content of less than 100 ppm.

BRIEF DESCRIPTION OF THE DRAWINGS

FIG. 3 shows four typical crystal forms of natural and synthetic diamond together with an indication of their crystal planes;

FIGS. 4 and 5 depict the temperature profile within a solvent and a carbon source;

FIG. 6 shows schematically a cell for diamond synthesis by the conventional thermal gradient method;

FIG. 7 shows schematically a cell for diamond synthesis by a modified thermal gradient method according to the present invention;

DESCRIPTION OF PREFERRED EMBODIMENTS

Synthetic diamonds used as heat sinks are conventionally produced by either the thermal gradient process or the film growth method, which is primarily used in grit making. For the purposes of the present discussion, a synthetic diamond produced by the thermal gradient process shown schematically in FIG. 6 is hereunder described.

We the inventors have conducted a series of experiments on diamond synthesis where the nitrogen content was from 5 to 150 ppm by increasing the diamond growth rate from 1 to 3.5 mm/hr. In the first run, we tried to control the growth rate by modifying the thermal gradient varying the distance between a carbon source 3 and a seed crystal 1 (i.e., changing the length of a solvent metal 2) depicted in FIG. 6. However, this method did not provide good linearity between the nitrogen content and the growth rate. Therefore, we placed a disk 7 of a high melting point and highly heat-conductive metal such as Mo under the seed crystal (as shown in FIG. 7) and varied the thickness of that disk for the purpose of changing the amount of heat dissipation directed downwardly. By this method, the thermal gradient between the seed crystal and carbon source was modified to control the diamond growth rate. As a result, good linearity between the two parameters was obtained.

Figure 8:
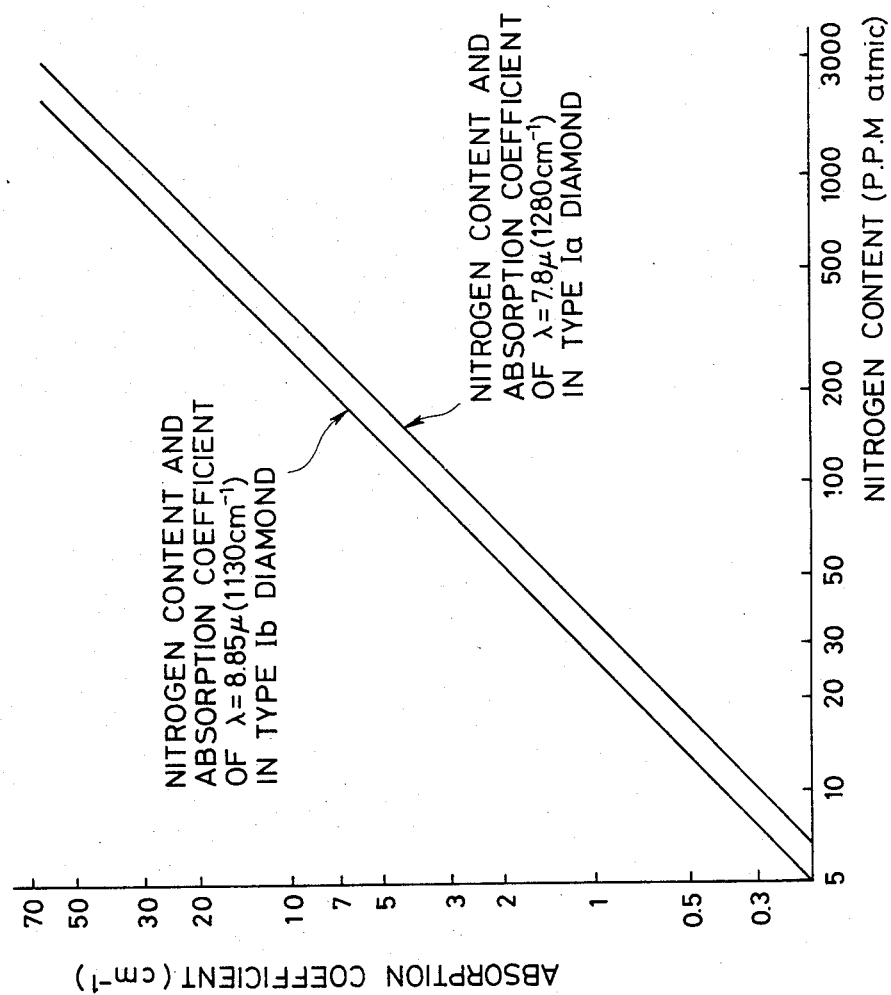
FIG. 8 is a graph showing the correlation between nitrogen content (plotted on the x-axis) and absorption coefficient (y-axis) for both Type Ia and Ib diamonds.
Figure 9:
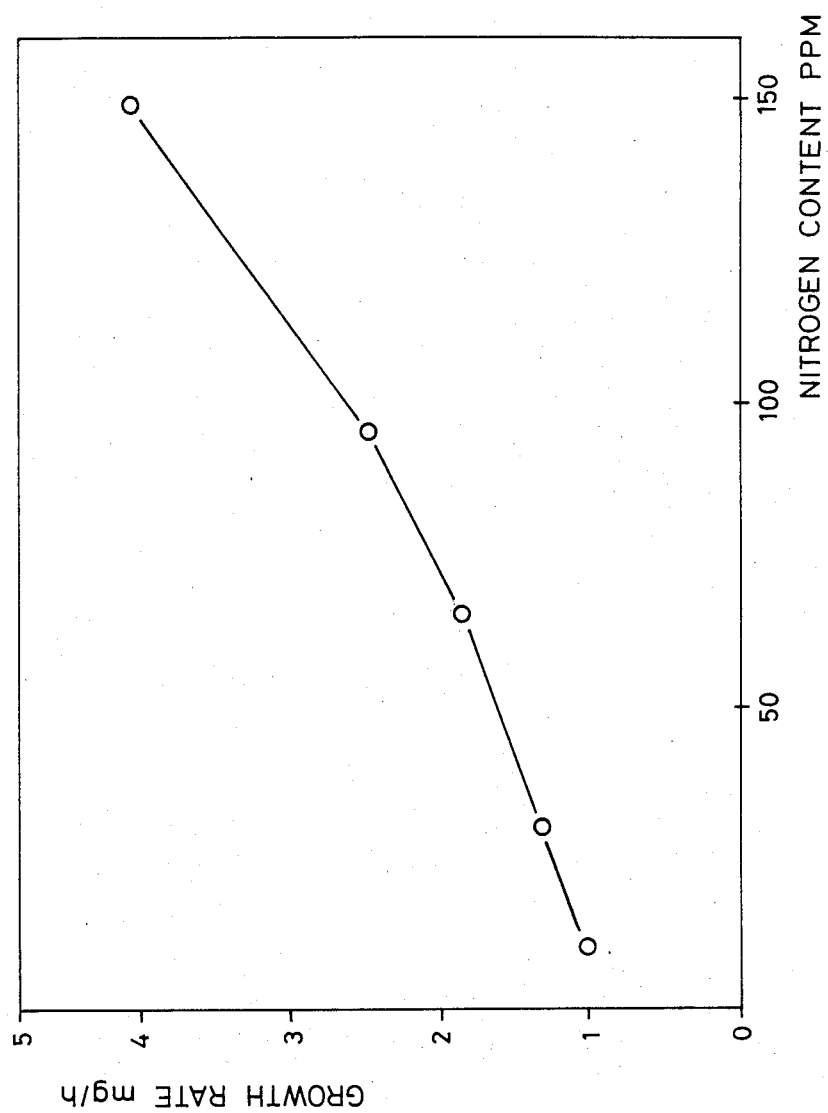
FIG. 9 is a graph showing the correlation between nitrogen content and diamond growth rate.

The nitrogen content was determined by measuring the absorption coefficient (1130 cm$^{-1}$) of the diamond with an IR analyzer. The correlation between the absorption coefficient and nitrogen content as determined by this second method is shown in FIG. 8. The correlation between the growth rate of the diamond crystal synthesized by this method using a nickel solvent and the nitrogen content of the diamond is shown in FIG. 9. Similar results were obtained when other solvent metals were used.

Figure 10:
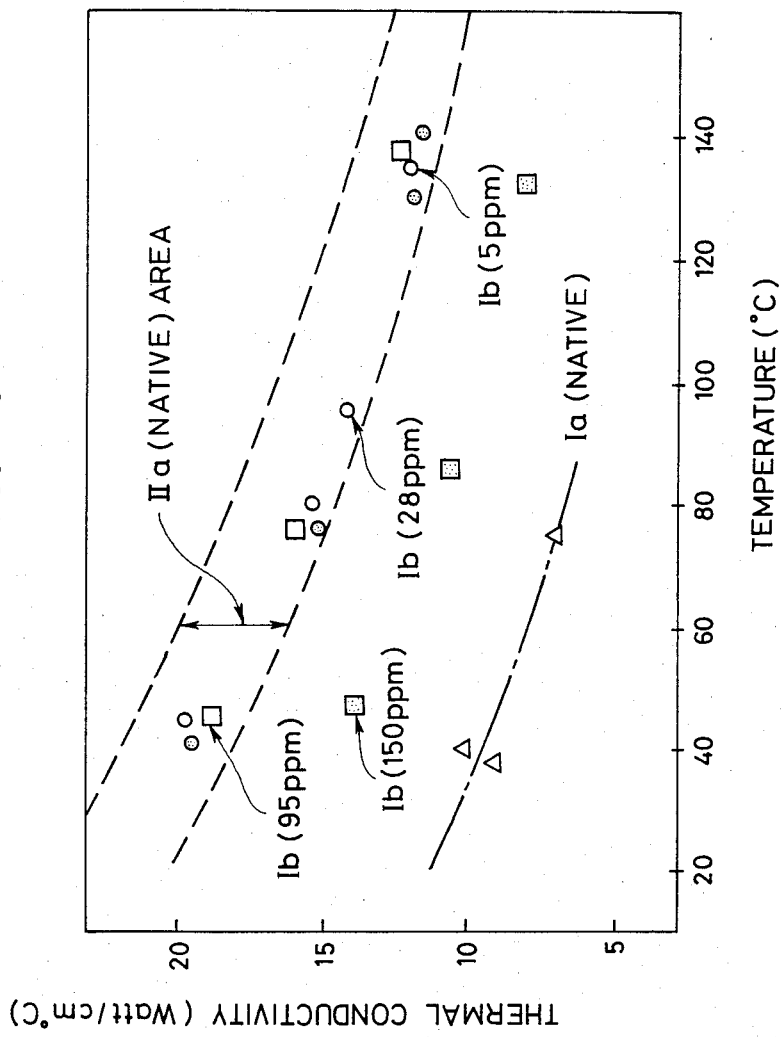
FIG. 10 shows the thermal conductivities of natural Type IIa diamond, synthetic Type Ib diamond (figures in parentheses indicate the nitrogen content), and natural Type Ia diamond plotted against temperature (x-axis)

Using the second method, Type Ib diamond crystals with 5 to 150 ppm of nitrogen were produced. Data relating to their thermal conductivity is shown in FIG. 10. With the nitrogen content in the range of 5 to 100 ppm, consistently high thermal conductivity values were obtained, but at 150 ppm of nitrogen, only a low thermal conductivity was obtained. This shows that heat sinks made of synthetic diamond crystals having 5 to 100 ppm of nitrogen have high thermal conductivity values which are distributed in a very narrow range.

Synthetic diamonds are characterized by a uniform solid solution of nitrogen (this is also the case with Type Ib diamonds), whereas natural diamonds of the other types have an aggregate of nitrogen molecules deposited on a certain crystal plane in a thickness of the order of several hundred angstroms. This is due to the difference in the environment of crystal growth. The nitrogen deposit on the natural diamond contributes to the scattering of phonons and greatly reduces the thermal conductivity of the diamond. This problem is minimal with the Type Ib synthetic diamond of the present invention characterized by nitrogen dissolution.

As mentioned above, shaping Type IIa natural mined diamonds to heat sinks involves the following two problems: (1) in the absence of a well-defined plane orientation, the detection of the "easy" working plane is an error-prone task; and (2) most diamond faces are curved and shaping them to the desired size is time consuming and produces excessive fines.

Figure 11:
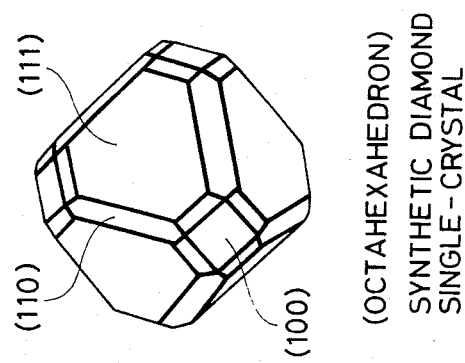
FIG. 11 depicts the shape of a typical synthetic single-crystal diamond.
Figure 12:
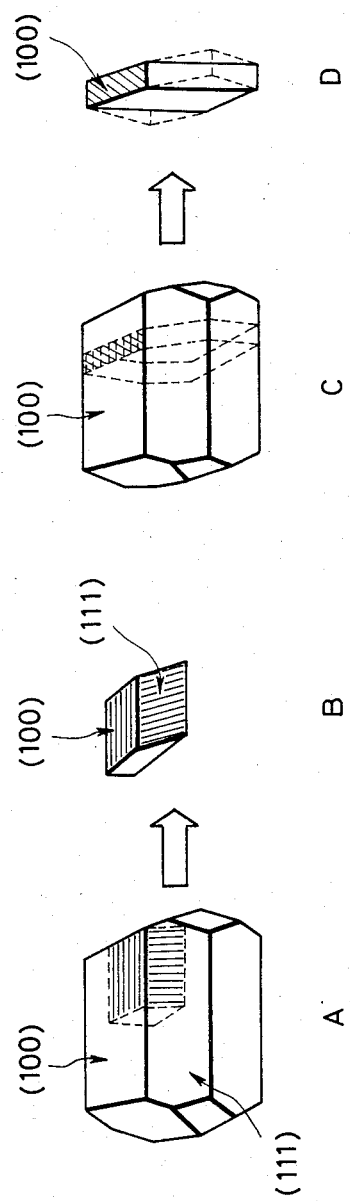
FIG. 12 shows two examples of using virgin crystal planes of a synthetic diamond directly as part of the surface of a heat sink.

The present invention eliminates the first problem by using a synthetic diamond having well-defined crystal planes (see FIG. 11). The synthetic diamond of this invention has flat planes, and thus virgin planes in the as-grown state may be immediately used as part of the heat sink. Two examples of using such grown virgin planes without shaping are illustrated in FIG. 12. In order to make a complete heat sink, gold or another metal must be coated onto a certain one of these planes. Usually, a crystal plane that has grown to a certain size has a large step left unstraightened. This is detrimental to the subsequent coating of gold or other metals. By adding silicon to the solvent metal or carbon source, crystal planes as smooth as a polished plane can be obtained. Another advantage of the Si addition is that it leads to a stronger Ti or Cr primer coating, probably because these metals form a silicide by reaction with Si during ion plating or sputtering. For the purpose of the present invention, the silicon content of a synthetic diamond is preferably not greater than 100 ppm.

Another feature of the present invention resides in that (110) planes can be readily selected as work planes having the largest area by using Type Ib synthetic diamonds, whose correct plane can be easily found. Because, as shown in TABLE 1, the (110) plane is readily ground, if the process is concentrated on this plane, the result is a less costly and more practical heat sink for electronic devices. For example, the flat surface having the largest area is the (110) plane in the heat sink as shown in FIG. 12D.

As will be apparent from the foregoing explanation, heat sinks having thermal conductivity values as high as those of natural Type IIa diamonds and which have a minimum variation can be made of synthetic Type Ib diamonds which have a nitrogen content in the range of 5 to 100 ppm. Because of these accompanying excellent thermal properties, heat sinks fabricated from such diamonds are suitable for use with electronic devices. The synthetic Type Ib diamonds according to the present invention are less expensive than natural Type IIa diamonds and can be easily shaped without producing excessive fines. As a further advantage, at least one crystal plane of these diamonds can be immediately used as part of the heat sink. Therefore, the present invention provides an inexpensive heat sink for electronic devices.

EXAMPLE 1

Figures 1A, 1B:
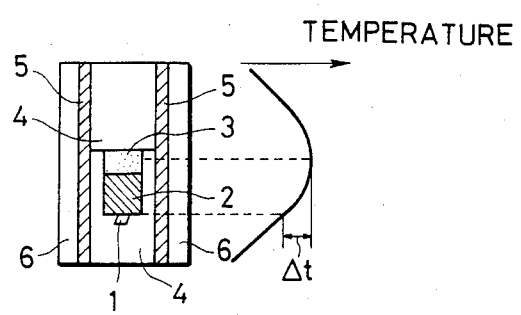
FIG. 1(a) shows schematically an apparatus used to produce synthetic diamonds by the temperature gradient process.
FIG. 1(b) is a graph showing the temperature profile in the axial direction.
Figure 2:
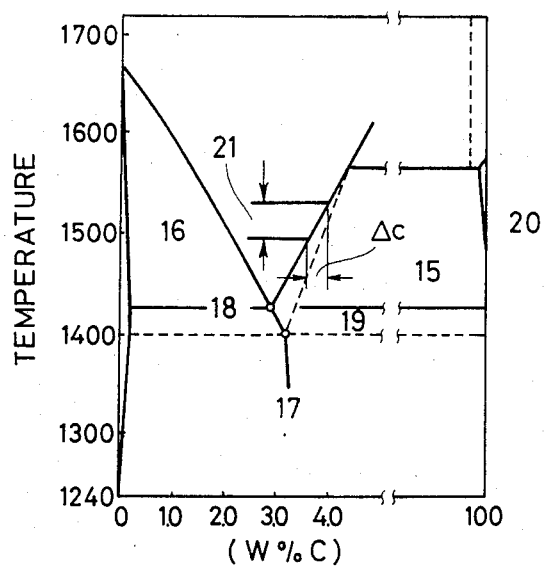
FIG. 2 is a solubility curve for nickel and carbon at very high pressures.

A synthetic diamond in a hexaoctahedral form of a size of 0.4 carat was produced by a modified technique of the thermal gradient process depicted in FIG. 2. An iron-nickel alloy was used as the solvent metal. Other synthesis conditions were as follows: temperature—1450° C., pressure —5.6 GPa, and duration—48 hours. The diamond had a nitrogen content of 48 ppm as measured with an IR analyzer. A laser was used to cut this synthetic diamond to a slice 0.8 mm thick. The slice was ground on both sides to a thickness of 0.6 mm, and using a laser it was shaped to a square form (1 mm×1 mm) to provide (100) planes of four lateral sides. The four corners of one major surface were chamfered at an angle of 45°. Following acid treatment, Ti and Au coats were deposited on that major surface by ion plating. A semiconductor laser was mounted on the completed heat sink and checked for its operating performance. The S/N ratio and life of the laser were equivalent to those of a laser mounted on a heat sink made of natural Type IIa diamond.

It is well known that the synthetic diamonds of Type Ib produced by the temperature gradient process have a thermal conductivity substantially similar to that of natural Type IIa diamonds (see H. M. Strong and R. M. Chrenko, "Further Studies on Diamond Growth Rate and Physical Properties of Laboratory-Made Diamond", *J. of Phy. Chem.*, vol. 75, no. 12, 1971). However, the variation in the thermal conductivity of synthetic diamonds having a nitrogen content in the range of 10 to 150 ppm has not been measured and researched.

Figure 13:
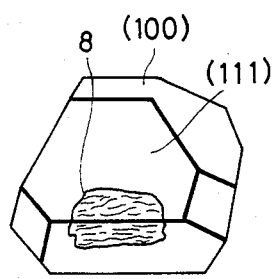
FIGS. 13 and 14 depict solvent entrapping that occurs upon a sudden drop in the temperature of the solvent.
Figure 14:
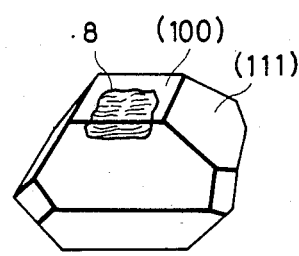
Figure 15:
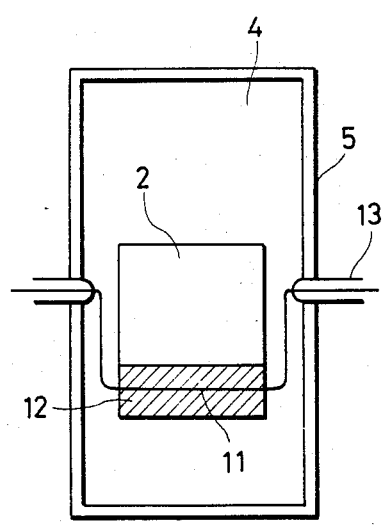
FIG. 15 shows schematically an apparatus used to measure the melting point of the solvent metal and carbon source system.

According to the process of the present invention, as the single crystal of diamond grows from the state shown in FIG. 4 to that shown in FIG. 5, the temperature of the solvent is gradually decreased so that the temperature of the frontmost end of the single crystal (indicated at 9 and 10 in FIG. 5) is held constant throughout the synthesis. Needless to say, the temperature of the solvent should not be lower than a temperature 20° C. higher than the melting point of the solvent metal and carbon source system, whereas the temperature of the solvent should not exceed a temperature 40° C. higher than the lower limit. The decreasing rate is also critical. If the rate is too slow, the temperature of the frontmost end of the single crystal cannot be held constant. Therefore, the lower limit of the decreasing rate is 0.15° C./hr. If the rate is too fast, there occurs a change in the rapidly growing face and solvent entrapping will easily take place. Therefore, the upper limit of the decreasing rate is 10° C./hr. If the temperature of the solvent is suddenly decreased, the growth rate of (111) planes is substantially lowered and that of (100) planes becomes high. Then, some parts of the (111) planes remain unfilled, and, as shown in FIG. 13, solvent entrapping parallel to the (111) planes occurs. On the other hand, if the temperature of the solvent is suddenly increased, the growth rate of (100) planes becomes small and solvent entrapping parallel to the (100) planes occurs as shown in FIG. 14. The optimum rate at which the temperature of the solvent is decreased varies with the amount of the solvent (the scale of the high-pressure apparatus used) and the type of the solvent. Experiments showed that the process of the present invention is capable of producing crude synthetic diamonds having not less than 80% of (100) planes, and which hence are very similar to the shape of a hexahedron.

The dependency of the crystal morphology on the temperature of the solvent would be explained by the fact that the surface tension of the solvent metal is highly dependent on temperature. As is well known, the crystal morphology is governed by Wolf's Law (see Formula (1) below). In this formula, $\gamma_i$ represents the surface energy at the solid-liquid interface between diamond and solvent and this is given by Equation (2).

$$h_i/\gamma_i = h_2/\gamma_2 \ldots h_i/\gamma_i = \text{constant}, \quad (1)$$

where $\gamma_i$=surface energy and $h_i$=the length of a line drawn vertically from Wolf's point to a specific crystal plane. Of the two parameters on the right side of the equation, the surface tension of the solvent metal is more temperature dependent.

$$\gamma_i = \sigma + \mu\Gamma = (\sigma_s - \sigma_e)\cos\theta + \mu\Gamma, \quad (2)$$

where $\sigma_s$=the surface tension of diamond, $\sigma_e$=the surface tension of the solvent, $\sigma$=surface tension at the solid-liquid interface, $\mu$=chemical potential, $\Gamma$=molar concentration per unit area, and $\theta$=angle of contact.

At atmospheric pressure, the absolute value of the surface tension of the solvent is less than 2,000 dynes/cm, and it does not change greatly enough for a temperature difference of only several decades of degrees (Celsius) to cause a shift from the (111) plane to the (100) plane. However, at very high pressures, the behavior of physical properties differs drastically from that at atmospheric pressure. The surface tension is not an exception, and its value at very high pressures is high and changes greatly with a slight temperature difference. As a result, the energy at the interface between diamond and solvent changes favorably either for the growth of the (100) plane or for the growth of the (111) plane. This appears to be the reason why the crystal morphology of synthetic diamond depends on the temperature of the solvent metal.

The present inventors have noted the importance of the surface tension of the solvent metal as a governing factor for the morphology of the final crystal, and made the following two improvements:

(i) elimination of impurities that reduce the surface tension of the solvent metal; and (ii) addition of an impurity that increases the difference between the energy at the interface of the (100) plane of diamond and the solvent metal and the energy at the interface of the (111) plane and the solvent metal.

Figure 16:
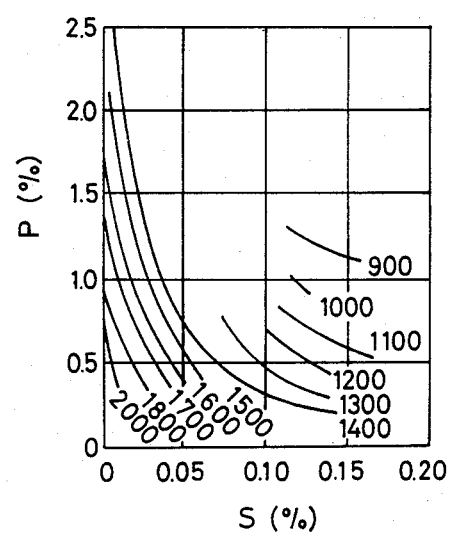
FIG. 16 shows the correlation between the addition of P/S and the surface tension (in dyne/cm) of an iron solvent (3.6 wt% C, 0.4 wt% Si and 0.3 wt% Mn) at 1,300° C. and at atmospheric pressure.

The first improvement is based on the observation that the higher the surface tension of the solvent metal, the greater the difference in surface tension due to a temperature gradient and the clearer the distinction between the growth of the (100) plane and that of the (111) plane. FIG. 16 shows how the surface tension of cast iron at atmospheric pressure varies as a result of the addition of phosphorus and sulfur. Obviously, the addition of these two elements causes a significant drop in the surface tension of cast iron. As a matter of fact, this observation holds good even for very high pressures and an octahexahedral or octahedral crystal is prone to result if phosphorus or sulfur is added to the solvent. In order to produce a crude hexahedral diamond crystal, phosphorus and sulfur should be present in amounts not greater than 0.5 wt% and 0.02 wt%, respectively.

The second improvement consists of adding tin or lead to a solvent metal selected from among cobalt, nickel, iron, chromium and manganese. By so doing, a crude diamond crystal having a shape close to that of a hexahedron can be obtained. The lower limit for the amount of these additions is 0.5 wt%, and if a smaller amount is used, the desired improvement cannot be attained. The upper limit for the amount of addition of tin or lead is 30 wt%; if a higher content is used, the growth rate of a diamond crystal is significantly reduced.

It is not fully understood why the addition of metallic tin or lead helps produce a crude diamond crystal nearly approaching a hexahedron, but a plausible explanation is as follows. As is well known, the surface tension of the metal differs depending upon whether it contacts the (100) plane or (111) plane of the diamond crystal. With metallic tin or lead in a liquid state, the two crystal planes have so great a difference in energy at the solid-liquid interface that the inherent difference between the two planes becomes manifest. Stated more specifically, by the addition of tin or lead to the solvent metal, the difference between the (100) plane and the (111) plane with respect to their growth conditions is augmented and the region favorable to the growth of the (100) plane can be ensured more easily than in the conventional technique.

As described in the foregoing, the present invention enables the synthesis of a crude diamond crystal having a major proportion of (100) plane, and hence having a shape close to that of a hexahedron. This form of crystal permits easy shaping without producing excessive fines. Therefore, industrial tools and devices can be fabricated at low cost from the crude diamond crystal produced by the present invention. Two typical applications of this diamond crystal are shown below.

(i) Wire-Drawing Dies

Wire-drawing dies can be produced by simply boring the crude crystal. This is less expensive than the conventional technique in which crude natural or synthetic diamond in an octahedral, dodecahedral or octahexahedral form is shaped to construct dies in a flattened form. According to the present invention, holes through which to draw wires are made in the (100) plane, ensuring the production of dies having a high fracture toughness.

(ii) Heat Sinks

Most conventional diamond heat sinks are made of natural Type IIa crude having good thermal conductivity. Crude synthetic diamonds with low nitrogen content ($\leq 100$ ppm) conduct as much heat as natural Type IIa diamonds and are hence suitable for use as heat sinks. The process of the present invention ensures the synthesis of a crude diamond weighing about 0.5 carat and having a shape nearly approaching a hexahedron. Compared with crude crystals in an octahedral, dodecahedral or octahexahedral form, the crude diamond according to the present invention can be easily shaped to the final size of a heat sink with minimum production of fines. The resulting heat sink is therefore much less expensive than the product obtained from natural or conventional synthetic diamonds.

The present invention will hereunder be described in greater detail by reference to further working examples, which are given here for illustrative purposes only.

EXAMPLE 2

A molten mixture of 99.99% pure nickel (70 wt%) and 99.99% pure iron (30 wt%) was used as a solvent metal. Analysis showed that the solvent contained 0.002 wt% of phosphorus and an equal amount of sulfur. The eutectic point of the solvent was measured with a cell having the structure shown in FIG. 5.

A regression formula of the internal temperature was determined on the basis of electrical power and several temperature parameters. During the synthesis of single diamond crystals, the power supply was so controlled that the temperature, estimated from this regression formula, was held constant. The results of the experiment are shown in the following table. Each of the single crystals had a melting point of 1,385° C. at 6.0 GPa.

| Run No. | 1 | 2 | 3 | 4 |
|---|---|---|---|---|
| Pressure | 6.0 GP | 6.0 GP | 6.0 GP | 6.0 GP |
| Temperature | 1,435° C. | 1,435° C. | 1,470° C. | 1,400° C. |
| Temperature Lowering Rate | 0.3° C./H | 0 | 0 | 0 |
| Synthesis Time | 40 Hr | 40 Hr | 40 Hr | 40 Hr |
| Yield (in carats) | 0.39 | 0.44 | 0.50 | 0.52 |
| Crystal Shape | Hexahedron | Hexaoctahedron | Octahexahedron | Agglomerate |
| Proportion of (100) Planes | 80% | 40% | 25% | Unknown |

EXAMPLE 3

A solvent metal was prepared from 99.99% pure cobalt plus 1% phosphorus. Analysis showed that the solvent contained 0.8 wt% of phosphorus. Another solvent was prepared from 99.99% pure cobalt plus 0.05% sulfur. Analysis showed that this solvent contained 0.03 wt% of sulfur. Three samples of single-crystal diamonds were synthesized using the two solvent metals and 99.99% pure cobalt. The internal temperature for the synthesis was controlled as in Example 2. The results are shown in the following table.

| Run No. | 21 | 22 | 23 |
|---|---|---|---|
| Pressure | 6.0 GP | 6.0 GP | 6.0 GP |
| Temperature | 1,440° C. | 1,440° C. | 1,440° C. |
| Temperature Lowering Rate | 0.5° C./Hr | 0.5° C./Hr | 0.5° C./Hr |
| P Content | 0.001 wt % | 0.8 wt % | 0.001 wt % |
| S Content | 0.002 wt % | 0.002 wt % | 0.03 wt % |
| Synthesis Time | 50 Hr | 50 Hr | 50 Hr |
| Yield (in carats) | 0.45 | 0.60 | 0.52 |
| Crystal Shape | Hexahedron | Octahexahedron | Octahexahedron |
| Proportion of (100) Planes | 82% | 20% | 25% |

EXAMPLE 4

A molten mixture of 99.99% pure nickel (80 wt%) and 99.99% pure chromium (20 wt%) was used as a solvent metal. Analysis showed that the solvent contained 0.002 wt% of phosphorus and an equal amount of sulfur. Three other solvents were prepared by adding 99.99% pure tin to the first solvent in amounts of 0.5, 10.0 and 40.0 wt%, respectively. Single crystal diamonds were synthesized using these four solvents in the same manner as in Example 2. The results are shown in the following table.

| Run No. | 31 | 32 | 33 | 34 |
|---|---|---|---|---|
| Pressure | 6.0 GP | 6.0 GP | 6.0 GP | 6.0 GP |
| Temperature | 1,380° C. | 1,380° C. | 1,380° C. | 1,380° C. |
| Temperature Lowering Rate | 0.3° C./Hr | 0.3° C./Hr | 0.3° C./Hr | 0.3° C./Hr |
| Sn Content | 0.0 wt % | 0.5 wt % | 10.0 wt % | 40.0 wt % |
| Synthesis Time | 40 Hr | 40 Hr | 40 Hr | 40 Hr |
| Yield (in carats) | 0.42 | 0.38 | 0.25 | Negligible |
| Crystal Shape | Hexahedron | Hexahedron | Hexahedron | |
| Proportion of (100) Planes | 80% | 89% | 91% | |

The same experiment was conducted by adding lead instead of tin and similar results were obtained.

We claim:

1. A heat sink for an electronic device comprising a synthetic crystal of Type Ib diamond containing 5 to 100 ppm nitrogen and having thermal conductivities higher than 20 W/cm °C. at room temperature.

2. The heat sink for electronic devices as claimed in claim 1, wherein said Type Ib diamond is a synthetic diamond crystal having a shape having not less than 80% of (100) planes synthesized by heating a carbon source, a solvent and a diamond seed crystal in the stability region of diamond at a high pressure, and adjusting the resulting temperature gradient between the carbon source and seed crystal in order to grow a diamond on the seed crystal, wherein said solvent is at least one metal selected from the group consisting of cobalt, nickel, iron, chromium and manganese, and the diamond crystal is caused to grow as the temperature of the solvent is gradually decreased at a rate of 0.15° to 10° C. per hour so that the temperature of the seed crystal and the growing diamond crystal is within a range the lower limit of which is a temperature 20° C. higher than the melting point of the solvent and carbon source system and the upper limit of which is a temperature 40° C. higher than said lower limit.

3. The heat sink for electronic devices as claimed in claim 2, wherein said solvent contains phosphorus and sulfur in an amount no greater than 0.5 wt% and 0.02 wt%, respectively.

4. The heat sink for electronic devices as claimed in claim 2, wherein said solvent contains a material selected from the group consisting of tin and lead in an amount in the range of 0.5 wt% and 30 wt%.

5. The heat sink for electronic devices as claimed in claim 3, wherein said solvent contains a material selected from the group consisting of tin and lead in an amount in the range of 0.5 wt% to 30 wt%.

* * * * *